United States Patent
Bae et al.

(10) Patent No.: US 9,065,653 B2
(45) Date of Patent: Jun. 23, 2015

(54) INTERNAL JITTER TOLERANCE TESTER WITH AN INTERNAL JITTER GENERATOR

(71) Applicants: Korea Advanced Institute of Science and Technology, Daejeon (KR); TeraSquare Co., Ltd., Seoul (KR)

(72) Inventors: HyunMin Bae, Daejeon (KR); Joon Yeong Lee, Daejeon (KR); Jin Ho Park, Seoul (KR); Tae Ho Kim, Seoul (KR)

(73) Assignees: Korea Advanced Institute of Science & Technology, Daejeon (KR); Terasquare Co., Ltd., Seoul (KR)

( * ) Notice: Subject to any disclaimer, the term of this patent is extended or adjusted under 35 U.S.C. 154(b) by 0 days.

(21) Appl. No.: 14/070,249

(22) Filed: Nov. 1, 2013

(65) Prior Publication Data

US 2015/0124861 A1 May 7, 2015

(51) Int. Cl.
 *H04L 1/20* (2006.01)
(52) U.S. Cl.
 CPC ........................................ *H04L 1/205* (2013.01)
(58) Field of Classification Search
 CPC ............... H03L 2207/50; H04L 1/205; H04L 2027/0063; H03M 1/0639
 USPC ................. 375/224, 226, 371, 373, 375, 376; 327/147, 156, 163
 See application file for complete search history.

(56) References Cited

U.S. PATENT DOCUMENTS

| | | | |
|---|---|---|---|
| 2008/0315928 A1* | 12/2008 | Waheed et al. | 327/159 |
| 2010/0097071 A1* | 4/2010 | Lee et al. | 324/537 |
| 2010/0150218 A1* | 6/2010 | Yaginuma et al. | 375/226 |

* cited by examiner

*Primary Examiner* — Leon Flores
(74) *Attorney, Agent, or Firm* — Christie, Parker & Hale, LLP

(57) ABSTRACT

Exemplary embodiments of the present invention relate to an internal jitter tolerance tester. The internal jitter tolerance tester may include a digital loop filter consisting of a cyclic accumulator which accumulates a phase detector's output, a gain multiplier, an internal accumulated jitter generator (or an internal sinusoid jitter generator), and a phase rotator (or DCO) controller.

The internal accumulated jitter generator may include a PRBS generator, a digital loop filter, an accumulator, and a gain controller. The accumulated jitter generator also may be replaced with the internal sinusoid jitter generator. The internal sinusoid jitter generator may include a counter, a sinusoid jitter profile lookup table, and a gain controller.

3 Claims, 9 Drawing Sheets

INTERNAL JITTER TOLERANCE TESTER WITH AN INTERNAL JITTER GENERATOR

BACKGROUND OF THE INVENTION

1. Field of the Invention

Exemplary embodiments of the present invention relate to a jitter tolerance test.

2. Discussion of the Background

The input jitter of a clock and data recovery (CDR) can be modeled as the sum of the accumulated and non-accumulative jitter. The non-accumulative period jitter does not accumulate over time and has bounded variance in general. Data-dependent deterministic jitter is a subset of the non-accumulative jitter. The accumulated jitter, on the contrary, is unbounded in nature and increases indefinitely with time.

A jitter tolerance mask provides the information on the accumulated and random non-accumulative jitter of a serial link.

Even if the practical jitter in a link is hardly composed of sinusoids, the jitter tolerance specification is defined with sinusoids for testing purpose. In practice, the jitter in serial links carrying real traffic is more like random noise.

SUMMARY OF THE INVENTION

An exemplary embodiment of the present invention discloses An internal jitter tolerance tester with an internal jitter generator, the jitter tolerance tester comprising a loop filter with a predetermined gain and a predetermined delay, an internal accumulated jitter generator to generate an accumulated jitter, a gain multiplier to be connected to the loop filter and the internal accumulated jitter generator, and a phase rotator controller to be connected to the gain multiplier.

The internal accumulated jitter generator comprises a pseudorandom binary sequence (PRBS) generator to generate 1 and −1 randomly.

The internal accumulated jitter generator further comprises a subsequent accumulator to accumulate a random signal.

The internal accumulated jitter generator further comprises a lowpass filter to eliminate a high frequency spur and a quantization noise.

The internal accumulated jitter generator further comprises a gain controller to control an amount of the accumulated jitter.

Another exemplary embodiment of the present invention discloses an internal jitter tolerance tester with an internal jitter generator, the jitter tolerance tester comprising a loop filter with a predetermined gain and a predetermined delay, an internal sinusoid jitter generator to generate a sinusoid jitter, a gain multiplier to be connected to the loop filter and the sinusoid jitter generator, and a phase rotator controller to be connected to the gain multiplier.

The sinusoid jitter generator comprises a counter to select a frequency of a jitter from a sinusoid jitter profile lookup table.

The sinusoid jitter generator further comprises a gain controller to control amplitude of the jitter.

Another exemplary embodiment of the present invention discloses an internal jitter tolerance tester with a DCO (digitally controlled oscillator), the jitter tolerance tester comprising a loop filter with a predetermined gain and a predetermined delay, an internal accumulated jitter generator to generate an accumulated jitter, a gain multiplier to be connected to the loop filter and the internal accumulated jitter generator, and a DCO to be connected to the gain multiplier.

The internal accumulated jitter generator comprises a PRBS generator to generate 1 and −1 randomly.

The internal accumulated jitter generator further comprises a lowpass filter to eliminate a high frequency spur and a quantization noise.

The internal accumulated jitter generator further comprises a gain controller to control an amount of the accumulated jitter.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED OF THE ILLUSTRATED EMBODIMENTS

Figure 1:
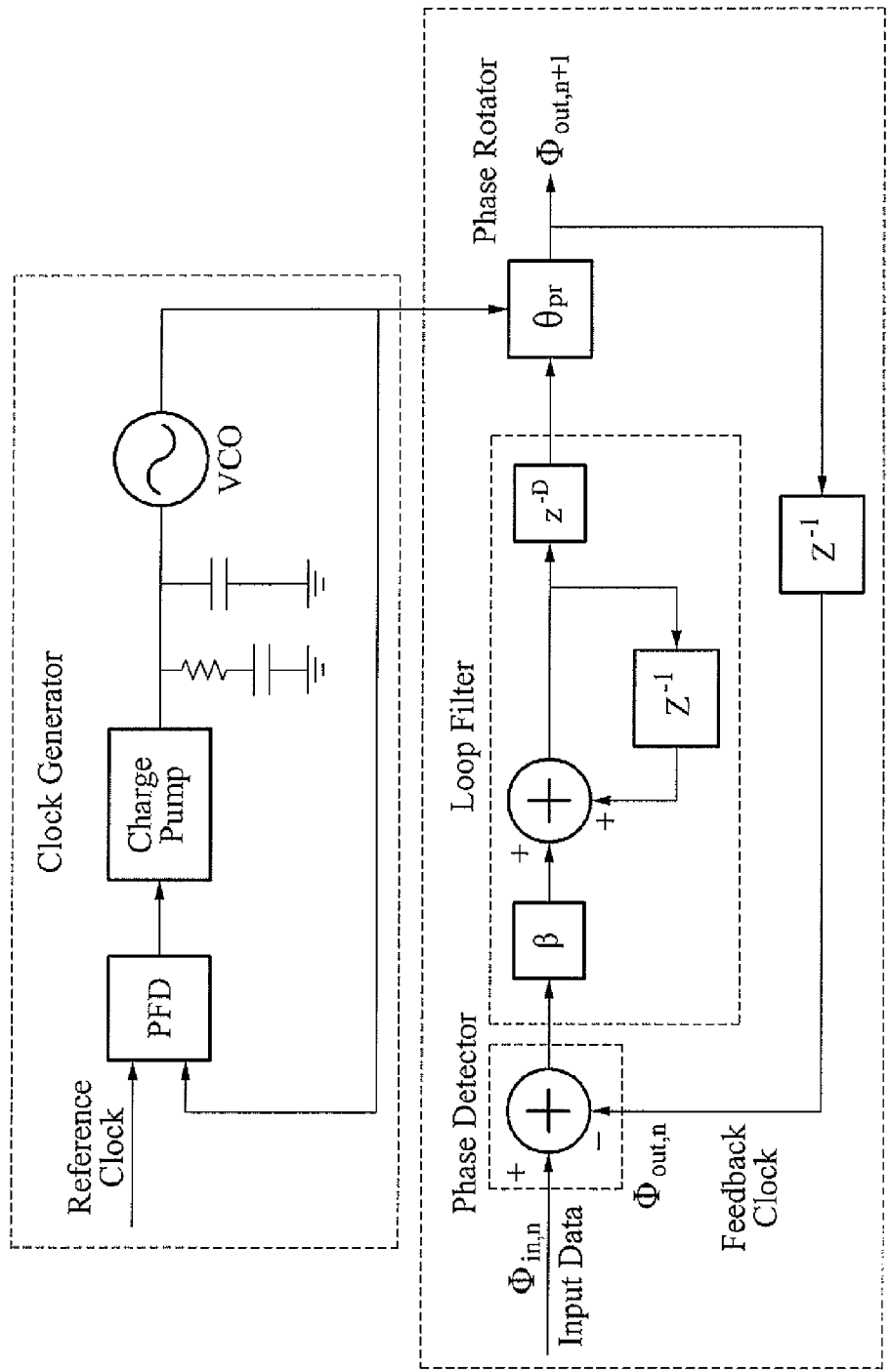
FIG. 1 shows a Z-domain block diagram of a typical rotator-based CDR with a clock generator.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

FIG. 1 shows a Z-domain block diagram of a typical rotator-based CDR with a clock generator. The clock generator may provide frequency locked clocks to a digitally controlled phase rotator. The CDR model may consist of a phase detector, a loop filter with a gain β and a delay D, respectively, and the digitally controlled phase rotator. The gain of a phase rotator θpr may be related to its resolution, as given by the following Equation 1.

$$\theta_{pr} = \frac{1 UI}{\text{Rotator resolution}} \qquad \text{[Equation 1]}$$

wherein the rotator resolution may be a reciprocal number of the phase rotator's minimum step size.

An input jitter of the CDR may be modeled as a sum of an accumulated and a non-accumulative period jitter. The non-accumulative period jitter may not accumulate over time and have bounded variance in general. A data-dependent deterministic jitter may be a subset of the non-accumulative jitter. The accumulated jitter, on the contrary, may be unbounded in nature and increase indefinitely with time, thus the CDR may have to track it for bit-error-free operation.

Figure 2:
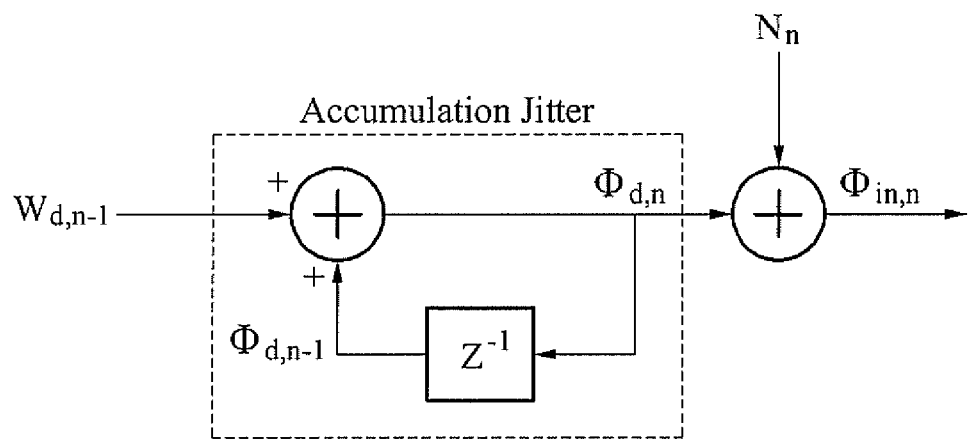
FIG. 2 shows a discrete time model of input jitter.

FIG. 2 shows a discrete time model of input jitter of the CDR. $\phi d,n$ and $N_n$ may denote the accumulated and non-accumulative period jitter, respectively, at time index n. The accumulated jitter may be modeled by a discrete time random walk process. By using the Z-transform, a power spectral density of the accumulated jitter may given by the following Equation 2.

$$S(f) = \frac{E[W^2]}{(1-z^{-1})(1-z)}\Big|_{z=e^{-j2\pi f/f_{Data}}} = \frac{E[W^2]}{4\sin^2(f\pi/f_{Data})} \qquad \text{[Equation 2]}$$

wherein $E[W^2]$ may be a variance of random period jitter W, and $f_{Data}$ may be a data rate. The Equation 2 may be simplified to the following Equation 3 by the bilinear transformation.

$$S(f) = \frac{E[W^2](1 + (f\pi/f_{Data})^2)}{(2f\pi/f_{Data})^2} \qquad \text{[Equation 3]}$$

wherein S(f) may decrease by −20 dB/decade as frequency increases.

Figure 3:
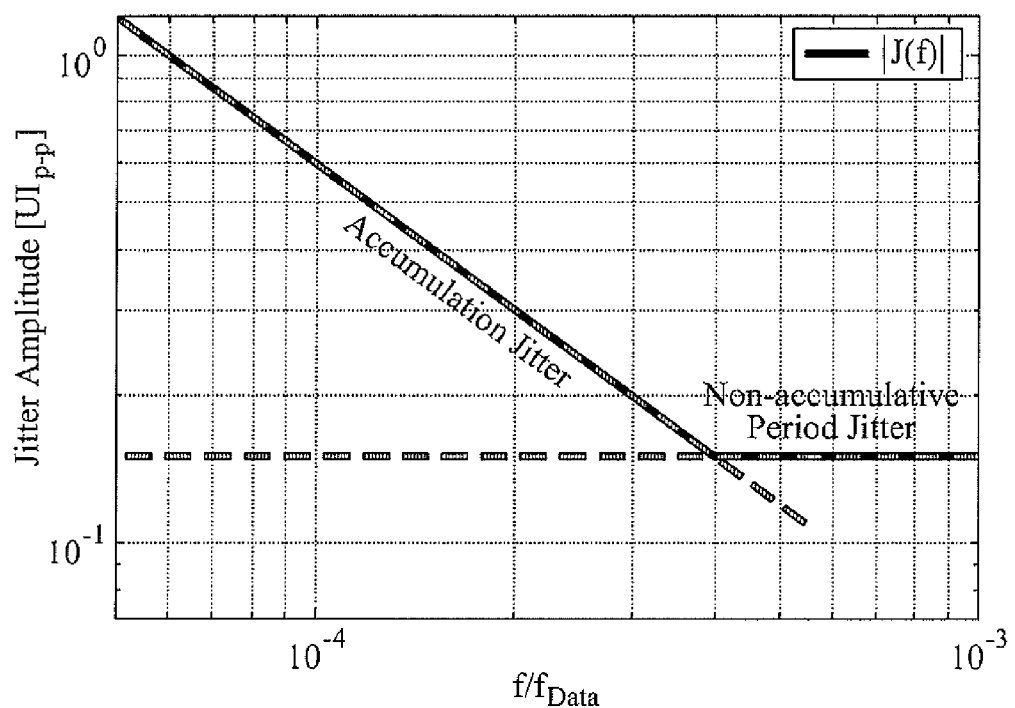
FIG. 3 show a typical shape of jitter tolerance mask.

FIG. 3 show a typical shape of jitter tolerance mask. The jitter tolerance mask may provide an information on the accumulated and a random non-accumulative period jitter of a serial link. The accumulated jitter may dominate at low frequencies and decrease by −20 dB/decade as frequency increases. In a SONET jitter tolerance mask, a magnitude of the random non-accumulative period jitter may intersect with the accumulated jitter at ½500th of the data rate.

A magnitude of S(f) may be estimated with the jitter tolerance mask since the jitter tolerance mask may represent the maximum permissible jitter present in a communication link. Even if a practical jitter in the communication link may be hardly composed of sinusoids, the jitter tolerance specification may be defined with sinusoids for testing purposes. In practice, the jitter in serial links carrying real traffic may be more like random noise.

Appropriate values for $\sigma_W$ and $\sigma_N$ may be estimated by matching the variances of the modeled jitter in the above FIG. 2 with the variances of a sinusoid defined in the jitter tolerance mask. The magnitude of the jitter tolerance mask may be J(f), and W and N may be white Gaussian processes. |S(f)| may satisfy $|S(f)|=|J(f)|^2/8$. For a SONET jitter mask, $\sigma_W$ may be $$\frac{0.6\pi}{\sqrt{2}} \times 10^{-4} UI_{rms}$$

and $\sigma_N$ may be 0.053 $UI_{rms}$, respectively, wherein $\sigma_N \gg \sigma_W$.

A creation of real world data traffic containing random accumulated jitter may be challenging in a lab environment. However, since the input jitter is a relative value between an input data phase and a recovered clock phase, a combination of a jittery recovered clock and a clean input data, and a combination of a jittery input data and a clean recovered clock may be in an unity inverse relationship, which magnitude may be same but direction may be opposite.

Figure 4:
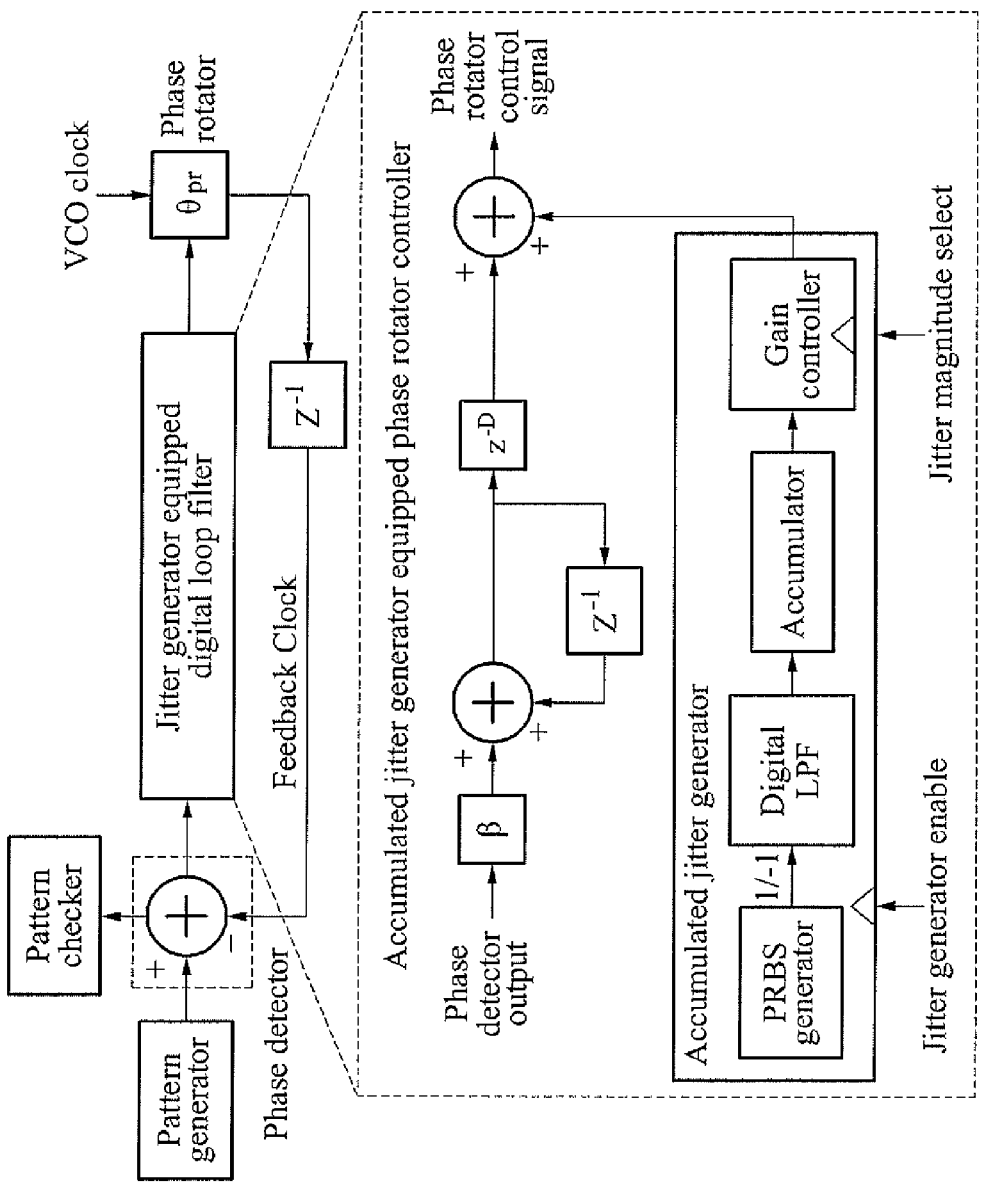
FIG. 4 is a view illustrating an example of an internal jitter tolerance tester with internal accumulated jitter generator according to an exemplary embodiment of the present invention.

FIG. 4 is a view illustrating an example of an internal jitter tolerance tester with internal accumulated jitter generator according to an exemplary embodiment of the present invention. A pseudorandom binary sequence (PRBS) generator may generate 1 and −1 randomly and a subsequent accumulator may accumulate a random signal. A lowpass filter may be used to eliminate a high frequency spur and a quantization noise. A pattern checker generates jitter-less input data and a pattern checker confirms the recovered data. By monitoring the bit-error-rate of the recovered data, the jitter tolerance specification of the CDR can be measured.

In accordance with an example of the present invention, the internal jitter tolerance tester with an internal jitter generator may include a loop filter with a predetermined gain β and a predetermined delay D, the internal accumulated jitter generator to generate an accumulated jitter, a gain multiplier to be connected to the loop filter and the internal accumulated jitter generator, and the phase rotator controller to be connected to the gain multiplier.

Figure 5:
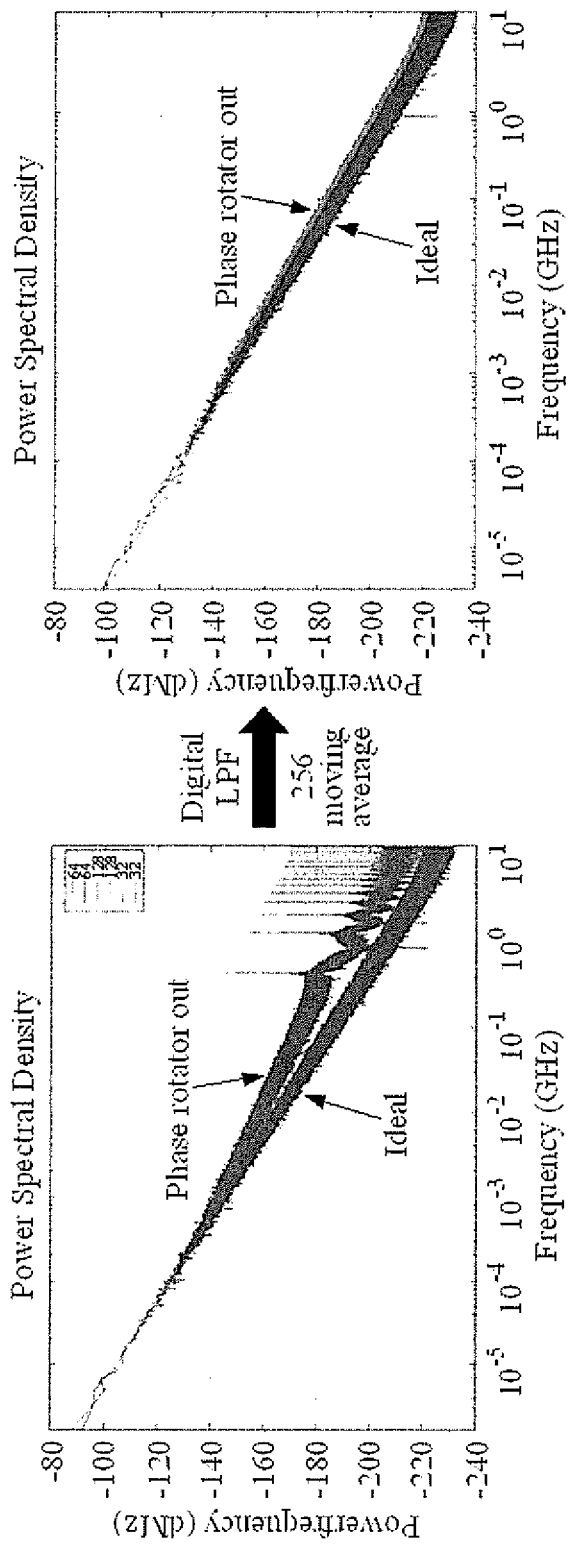
FIG. 5 is a view illustrating an example of a power spectral density function of a phase rotator output phase with and without the lowpass filter according to an exemplary embodiment of the present invention.

FIG. 5 is a view illustrating an example of a power spectral density function of a phase rotator output phase with and without the lowpass filter according to an exemplary embodiment of the present invention. The lowpass filter may be located between the PRBS generator and the accumulator or after the accumulator. A gain controller may control an amount of the accumulated jitter.

Figure 6:
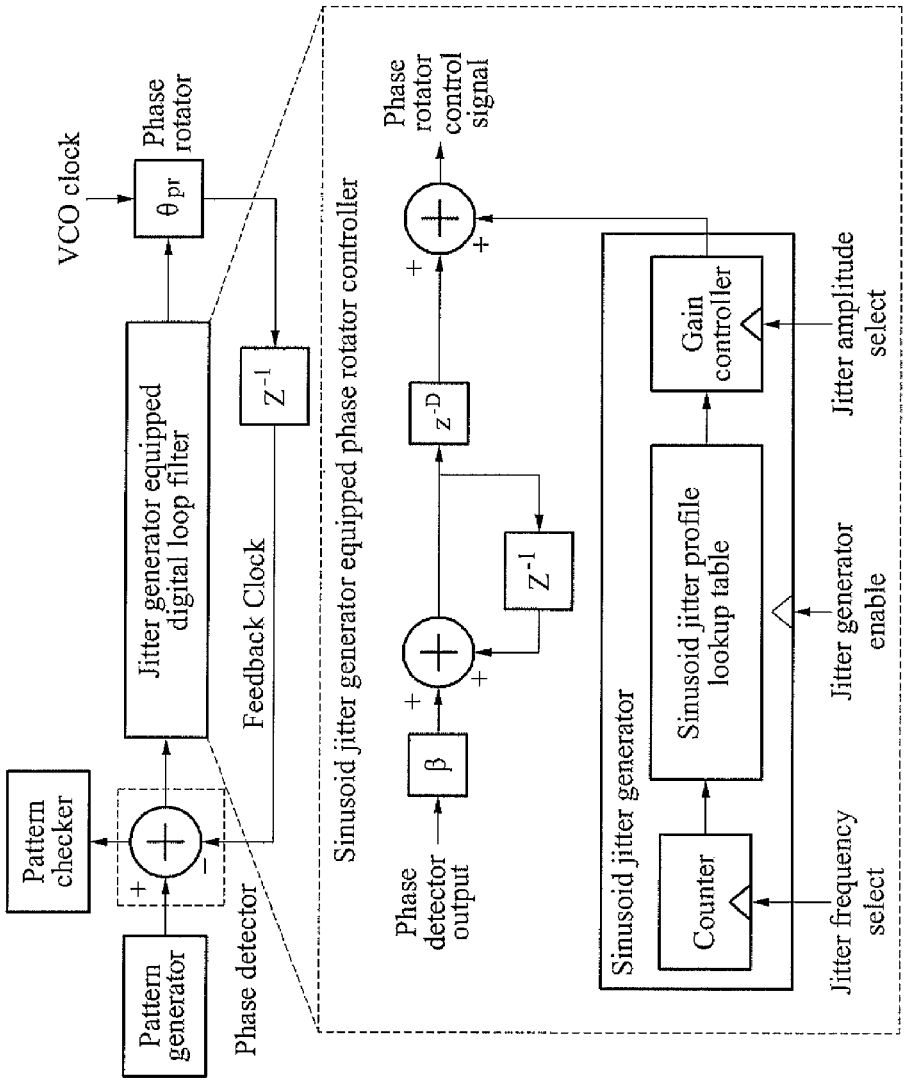
FIG. 6 is a view illustrating an example of an internal jitter tolerance tester with internal sinusoid jitter generator according to an exemplary embodiment of the present invention.

FIG. 6 is a view illustrating an example of a sinusoid jitter generator equipped phase rotator controller according to an exemplary embodiment of the present invention. The accumulated jitter generator also may be replaced with the sinusoid jitter generator. A various CDRs' jitter tolerance performance under various conditions may be checked by selecting a frequency and an amplitude of the jitter. A pattern checker generates jitter-less input data and a pattern checker confirms the recovered data. By monitoring the bit-error-rate of the recovered data, the jitter tolerance specification of the CDR can be measured.

In accordance with an example of the present invention, the internal jitter tolerance tester with the internal jitter generator may include the loop filter with the predetermined gain β and the predetermined delay D, a sinusoid jitter generator to generate an accumulated jitter, the gain multiplier to be connected to the loop filter and the sinusoid jitter generator, and the phase rotator controller to be connected to the gain multiplier.

A proposed architecture may also be applied to any digitally-controlled-oscillator (DCO) based type-2 designs since a second order loop may be often overdamped and hence behave very similarly to a first-order loop.

Figure 7:
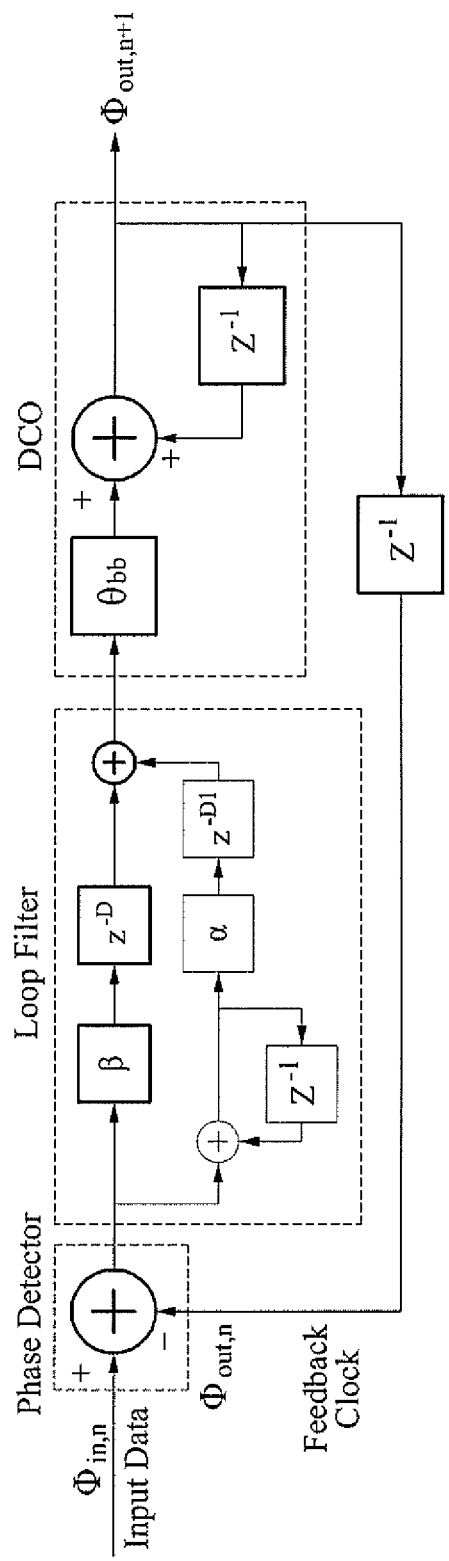
FIG. 7 is a view illustration an example of a Z-domain block diagram of a DCO-based type-2 digital CDR according to an exemplary embodiment of the present invention.

FIG. 7 is a view illustration an example of a Z-domain block diagram of a DCO-based type-2 digital CDR according to an exemplary embodiment of the present invention. The phase step of the loop may be given by the following Equation 4.

$$\theta_{vco} = \frac{K_{vco}}{f_0}[UI] \qquad \text{[Equation 4]}$$

wherein $K_{vco}$ may denote a DCO gain and $f_0$ may denote a nominal frequency, respectively. In the case of $\alpha=0$, only difference between a phase rotator-based CDR and a DCO-based CDR may be a location of the phase accumulator.

Figure 8:
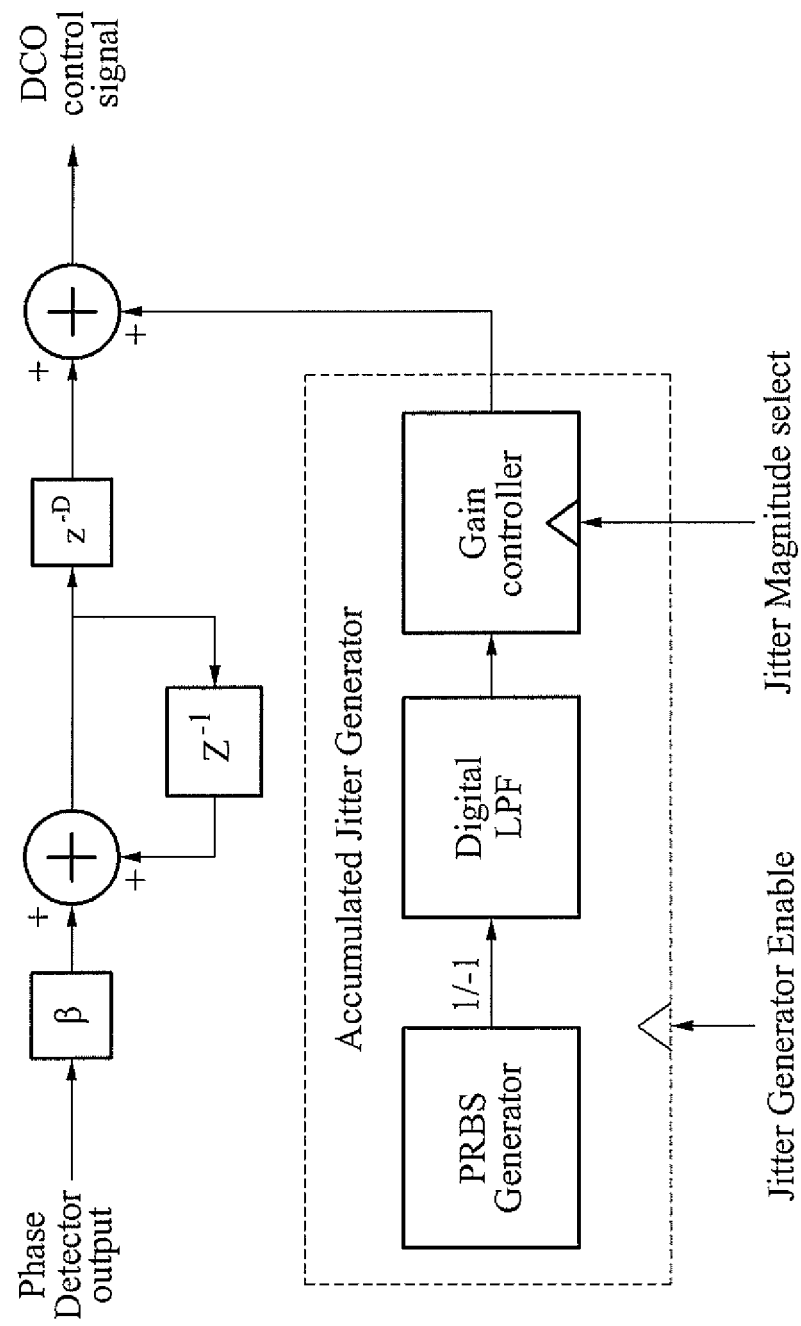
FIG. 8 is a view illustration an example of an accumulated jitter generator equipped DCO controller according to an exemplary embodiment of the present invention.

FIG. 8 is a view illustration an example of an accumulated jitter generator equipped DCO controller according to an exemplary embodiment of the present invention. The accumulator may be eliminated from the accumulated jitter generator equipped phase rotator controller, since a DCO may operate as the phase accumulator.

In accordance with an example of the present invention, the internal jitter tolerance tester with a DCO (digitally controlled oscillator) may include the loop filter with a predetermined gain β and a predetermined delay D, the internal accumulated jitter generator to generate the accumulated jitter, the gain multiplier to be connected to the loop filter and the internal accumulated jitter generator, and the DCO to be connected to the gain multiplier.

The internal jitter tolerance tester may include a digital loop filter consisting of a cyclic accumulator which accumulates a phase detector's output, a gain multiplier, an internal accumulated jitter generator (or internal sinusoid jitter generator), and a phase rotator (or DCO) controller.

The internal accumulated jitter generator may include the PRBS generator, the digital loop filter, the accumulator, and the gain controller. The PRBS generator may generate 1 and −1 randomly and the subsequent accumulator may accumulate the random signal. The lowpass filter may be used to eliminate the high frequency spur and the quantization noise. The gain controller may control the amount of the accumulated jitter.

The accumulated jitter generator also may be replaced with the sinusoid jitter generator. The internal sinusoid jitter generator may include a counter to select a frequency of a jitter from a sinusoid jitter profile lookup table, the sinusoid jitter profile lookup table, and a gain controller. The size of the counter may be proportional to a maximum period of the sinusoid jitter and the frequency of the sinusoid jitter may be controlled by selecting a size of the counter's counting step, while maintaining the clock frequency. The counter number may select a value of the jitter from the sinusoid jitter profile lookup table, and the gain controller may control the amplitude of the jitter.

The exemplary embodiments according to the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

Figure 9:
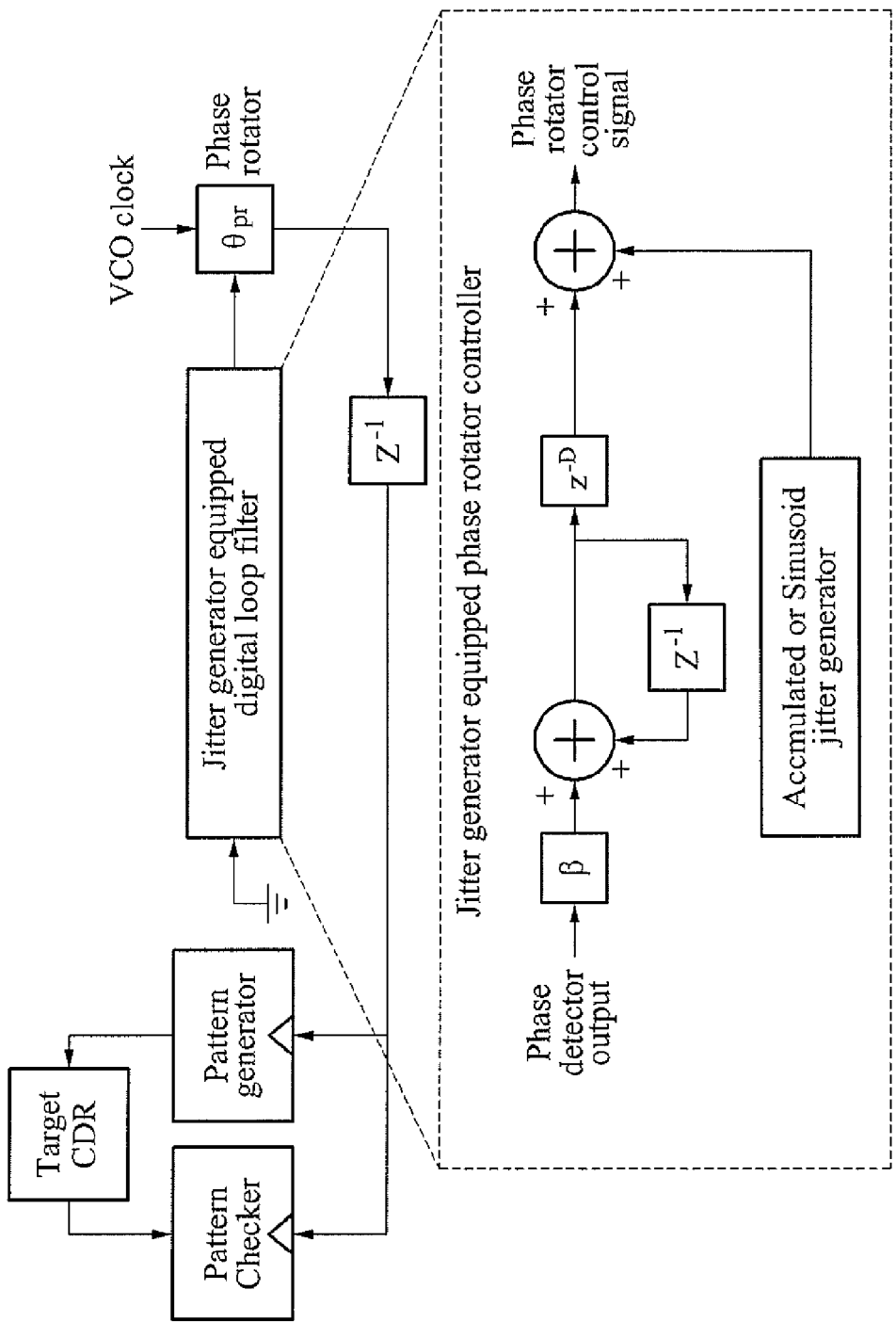
FIG. 9 is a view illustration an example of a jitter tolerance test method by using the accumulated jitter-equipped pattern generator.

The internal jitter generator also may be used as a jitter-equipped pattern generator. FIG. 9 is a view illustration an example of a jitter tolerance test method by using the accumulated jitter-equipped pattern generator. The jitter generator equipped digital loop filter and a phase rotator can generate a jitter-equipped clock signal and the jitter-equipped pattern can generated by using the clock as the sync clock of a pattern generator. The jitter tolerance spec of a target CDR can be measured by using the jitter-equipped pattern.

What is claimed is:

1. An internal jitter tolerance tester with an internal jitter generator, the jitter tolerance tester comprising:
 a loop filter with a predetermined gain and a predetermined delay;
 an internal accumulated jitter generator to generate an accumulated jitter and output the generated accumulated jitter to a gain multiplier;
 the gain multiplier to be connected to an output of the loop filter and be connected to an output of the internal accumulated jitter generator; and
 a phase rotator controller to be connected to an output of the gain multiplier and to generate a jitter-equipped clock signal,
 wherein the internal accumulated jitter generator comprises,
 a pseudorandom binary sequence (PRBS) generator to generate 1 and −1 randomly;
 a subsequent accumulator to be connected to an output of the pseudorandom binary sequence generator and accumulate a random signal;
 a lowpass filter to be connected between the pseudorandom binary sequence generator or be connected to an output of the subsequent accumulator, the lowpass filter eliminating a high frequency spur and a quantization noise; and
 a gain controller to be connected to an output of the subsequent accumulator or be connected to an output of the lowpass filter, the gain controller controlling an amount of the accumulated jitter.

2. An internal jitter tolerance tester with an internal jitter generator, the jitter tolerance tester comprising:
 a loop filter with a predetermined gain and a predetermined delay;
 an internal sinusoid jitter generator to generate a sinusoid jitter and output the generated sinusoid jitter to a gain multiplier;
 the gain multiplier to be connected to an output of the loop filter and be connected to an output of the sinusoid jitter generator; and
 a phase rotator controller to be connected to an output of the gain multiplier and to generate a jitter-equipped clock signal,
 wherein the sinusoid jitter generator comprises,
 a counter to select a frequency of a jitter from a sinusoid jitter profile lookup table; and
 a gain controller to be connected to an output of the counter and control an amplitude of the jitter.

3. An internal jitter tolerance tester with a DCO (digitally controlled oscillator), the jitter tolerance tester comprising:
 a loop filter with a predetermined gain and a predetermined delay;
 an internal accumulated jitter generator to generate an accumulated jitter and output the generated sinusoid jitter to a gain multiplier;

the gain multiplier to be connected to an output of the loop filter and be connected to an output of the internal accumulated jitter generator; and a DCO to be connected to an output of the gain multiplier, wherein the internal accumulated jitter generator comprises, a PRBS generator to generate 1 and −1 randomly;

a lowpass filter to be connected to an output of the PRBS generator and eliminate a high frequency spur and a quantization noise; and a gain controller to be connected to an output of the lowpass filter and control an amount of the accumulated jitter wherein, the DCO accumulates the accumulated jitter.

* * * * *